United States Patent
Zoels et al.

(10) Patent No.: US 10,897,250 B2
(45) Date of Patent: Jan. 19, 2021

(54) SYSTEMS AND METHODS FOR CONTROLLING DYNAMIC AVALANCHE IN SWITCHING DEVICES

(71) Applicant: General Electric Company, Schenectady, NY (US)

(72) Inventors: Thomas Alois Zoels, Munich (DE); Henry Todd Young, Erie, PA (US); Jason Daniel Kuttenkuler, Erie, PA (US)

(73) Assignee: TRANSPORTATION IP HOLDINGS, LLC, Norwalk, CT (US)

( * ) Notice: Subject to any disclaimer, the term of this patent is extended or adjusted under 35 U.S.C. 154(b) by 0 days.

(21) Appl. No.: 16/193,926

(22) Filed: Nov. 16, 2018

(65) Prior Publication Data

US 2020/0162073 A1  May 21, 2020

(51) Int. Cl.
  *H03K 3/00*    (2006.01)
  *H03K 17/567*  (2006.01)
(52) U.S. Cl.
  CPC .................. *H03K 17/567* (2013.01)
(58) Field of Classification Search
  CPC .................................................. H03K 17/567
  (Continued)

(56) References Cited

U.S. PATENT DOCUMENTS 4,800,339 A * 1/1989 Tanimoto ............. H03F 3/3001
  330/253
5,610,547 A * 3/1997 Koyama ................ G06G 7/24
  327/350

(Continued)

FOREIGN PATENT DOCUMENTS

EP  2418774 A1    9/2011
EP  2418774 A1 *  2/2012  ......... H03K 17/0828
(Continued)

OTHER PUBLICATIONS

Ogura, Tsunco, et al.; "Turn-off switching analysis considering dynamic avalanche effect for low turn-off loss high-voltage IGBTs", IEEE Transactions on Electron Devices, vol. 51, Issue: 4, pp. 629-635, Apr. 2004.
Jiang, Lu et al.; "Dynamic avalanche behavior of power MOSFETs and IGBTs under unclamped inductive switching conditions", Journal of Semiconductors, vol. 34, Issue: 3, 5 pages, Mar. 2013.
Muenster, Patrick, et al.; "Impact of the dynamic avalanche on the electrical behavior of HV-IGBTs", Proceedings of PCIM Europe 2015; International Exhibition and Conference for Power Electronics, Intelligent Motion, Renewable Energy and Energy Management, pp. 1-10, Germany, May 19-20, 2015.
(Continued)

*Primary Examiner* — Ryan Jager
(74) *Attorney, Agent, or Firm* — Joseph F. Harding; The Small Patent Law Group LLC (57) ABSTRACT

Systems and methods for mitigating occurrences of dynamic avalanche events are presented. An electrical system may include a gate-drive unit electrically coupled to a semiconductor switching device and used to drive the switching device by applying a voltage to a gate terminal of the switching device. The electrical system may also include a controller that indicates the switching device to turn off and determines system parameters in response to the switching device turning-off. The controller may determine an intermediate gate voltage based at least in part on the system parameters and may modify the gate-drive unit configuration to apply the appropriate intermediate gate voltage to the gate terminal. The controller may additionally modify the gate-drive unit configuration to apply a turn-off voltage at the gate terminal subsequent to the application of the intermediate gate voltage.

20 Claims, 6 Drawing Sheets

(58) Field of Classification Search
USPC .......................................................... 327/109
See application file for complete search history.

(56) References Cited

U.S. PATENT DOCUMENTS

| | | | | |
|---|---|---|---|---|
| 5,926,012 | A * | 7/1999 | Takizawa | H03K 17/0828 |
| | | | | 323/284 |
| 6,771,097 | B1 * | 8/2004 | Poh Ho | H03K 19/0005 |
| | | | | 326/30 |
| 7,236,340 | B2 | 6/2007 | Maloyan et al. | |
| 7,635,909 | B2 | 12/2009 | Mauder et al. | |
| 7,990,196 | B2 * | 8/2011 | Voegele | H03K 19/018585 |
| | | | | 327/108 |
| 8,264,035 | B2 | 9/2012 | Hsieh | |
| 8,717,069 | B2 | 5/2014 | Curbelo et al. | |
| 9,444,448 | B2 | 9/2016 | Wagoner et al. | |
| 9,473,135 | B2 * | 10/2016 | Garg | H03K 17/687 |
| 9,515,066 | B2 | 12/2016 | Laven et al. | |
| 9,590,609 | B1 * | 3/2017 | Musa | H03K 17/162 |
| 9,627,517 | B2 | 4/2017 | Schulze et al. | |
| 2006/0244479 | A1 * | 11/2006 | Major | H03K 17/163 |
| | | | | 326/29 |
| 2015/0326009 | A1 | 11/2015 | Mari Curbelo et al. | |
| 2015/0358011 | A1 * | 12/2015 | Tang | H03K 5/1534 |
| | | | | 327/109 |
| 2018/0062633 | A1 * | 3/2018 | Nomura | H03K 17/163 |

FOREIGN PATENT DOCUMENTS

| | | |
|---|---|---|
| EP | 3035532 A1 | 10/2015 |
| JP | 2002153043 A | 5/2002 |
| JP | 2004312796 A | 11/2004 |
| JP | 2016174455 A | 9/2016 |

OTHER PUBLICATIONS

Geissmann, Silvan, et al.; "Extraction of dynamic avalanche during IGBT turn off", Microelectronics Reliability, vol. 76-77, pp. 495-499, Aug. 2017.
Extended European Search Report dated Mar. 12, 2020 for corresponding EP Application No. 19197465.8 (9 pages).
Bryant, A. et al., 'Investigation Into IGBT dV/dt During Turn-Off and Its Temperature Dependence', IEEE Transactions on Power Electronics, vol. 26, No. 10, Oct. 2011, pp. 3019-3031.
Examination report No. 1 for Standard Patent Application dated May 6, 2020 for corresponding application No. AU2019246788. 10 Pages.

* cited by examiner

SYSTEMS AND METHODS FOR CONTROLLING DYNAMIC AVALANCHE IN SWITCHING DEVICES

BACKGROUND

The subject matter disclosed herein relates to semiconductor switching devices, and, more specifically, to systems and methods for reducing performance degradation of the switching devices due to dynamic avalanche events.

This section is intended to introduce the reader to certain aspects of art that may be related to aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Electrical systems may be used in a vast range of applications, including power electronics converters (e.g., for transportation equipment, mining equipment, oil and gas equipment, etc.), computing devices, refrigeration systems, and so forth. These electrical systems may frequently employ semiconductor switching devices (e.g., transistors) to control current flow through circuits of the electrical system. For example, the switching devices may open and/or close paths of the circuits to to selectively control the flow of power to components of the electrical system. To control switching device operations, a voltage (VGE) may be applied to a terminal of the switching device to turn-on (e.g., enable propagation of current) or turn-off (e.g., disable propagation of current) the switching device. During turn-off however, the switching device may be subject to a current density and voltage magnitude that results in rapid generation of additional, unwanted charge carriers. In such instances, the kinetic energy of these charge carriers within the switching device may rapidly increase beyond a tolerable threshold, wearing switching device material and degrading performance and reliability.

BRIEF DESCRIPTION

Certain embodiments commensurate in scope with the originally claimed invention are summarized below. These embodiments are not intended to limit the scope of the claimed invention and are intended only to provide a brief summary of possible forms of the invention. Indeed, the invention may encompass a variety of forms that may be similar to or different from the embodiments set forth below.

In one embodiment, an electrical system having a gate-drive circuit is described. The gate-drive unit may be electrically coupled to a semiconductor switching device and may drive the semiconductor switching device by applying a voltage to a gate terminal of the semiconductor switching device. The electrical system may also include a controller that indicates to the semiconductor switching device to turn-off. The controller may determine system parameters in response to indicating to the semiconductor switching device to turn-off. The controller may further determine an intermediate gate voltage based at least in part on the system parameters. Furthermore, the controller may adjust the gate-drive unit configuration to apply the intermediate gate voltage at the gate terminal. Additionally, the controller may adjust the gate-drive unit configuration to apply the turn-off voltage at the gate terminal subsequent to the application of the intermediate gate voltage in response to commutation of a current propagating through the semiconductor switching device.

In one embodiment, a method for mitigating occurrences of dynamic avalanche events in a semiconductor switching device is described. The method may include determining one or more values of system parameters in response to indicating the semiconductor switching device to enter a turn-off mode. The method may also include determining whether to apply an intermediate gate voltage to the semiconductor switching device. The method may further include, in response to determining to apply an intermediate gate voltage, determining an intermediate gate voltage based at least in part on the one or more values, wherein the intermediate gate voltage comprises a voltage between a turn-off threshold and a turn-off voltage. Furthermore, the method may include adjusting a configuration of a gate-drive unit coupled to the semiconductor switching device to a first configuration for applying the intermediate gate voltage and applying the intermediate gate voltage in response to configuring the gate-drive unit to the first configuration. Additionally, the method may include adjusting a configuration of a gate-drive unit to a second configuration for applying the turn-off voltage and applying the turn-off voltage in response to configuring the gate-drive unit to the second configuration.

A further embodiment in this disclosure includes gate-drive unit used to drive a semiconductor switching device coupled to the gate-drive unit. The gate-drive unit may include one or more power rails. The gate-drive unit may also include one or more power sources that may each drive at least one of the one or more power rails. Further, the gate-drive unit may also a resistor stage. The resistor stage may include a positive bus gate resistor and a negative bus gate resistor. Additionally, the resistor stage may include a plurality of switches of which each switch may couple the positive bus gate resistor, the negative bus gate resistor, or combination thereof to at least one of the one or more power rails based at least in part on whether the gate-drive unit is to apply an intermediate gate voltage to the semiconductor switching device or a turn-off voltage to the semiconductor switching device.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments of the present subject matter will be described below. In an effort to provide a concise description of these embodiments, certain features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Further, the application may make reference to certain electrical measurement metrics. As such, it should be understood that "A" may refer to amperes and "V" may refer to volts.

Semiconductor switching devices (e.g., insulated-gate bipolar transistors (IGBTs), metal-oxide-semiconductor field-effect transistors (MOSFETs), bipolar switching devices, and the like) may be used to control electrical behavior of systems based on their operating state (e.g., on or closed, off or open). For example, to control the flow of current to and from component(s) (e.g., electrical load) of the system, a switching device may turn on, closing an electrical path to one or more components and enabling current to flow to the component(s).

To control the operating state of the switching devices, a voltage or current may be applied to a device terminal to open or close a current channel (e.g., conducting metal-oxide semiconductor (MOS) channel) through the switching device. As an example, a gate-drive unit may vary the voltage applied to the gate terminal of an IGBT (e.g., trench-gate IGBTs) to turn-on or turn-off the IGBT. Turning-on the IGBT switching device may entail applying a positive gate voltage at least until the gate voltage reaches a turn-on voltage threshold with respect to another device terminal (e.g., emitter). Once the gate voltage has reached and/or surpassed the turn-on voltage threshold, the IGBT may enable free charge carriers to flow between non-gate terminals (e.g., collector and emitter power terminals) and thus, enable propagation of current through the switching device.

On the other hand, turning-off the IGBT switching device may include reducing the gate voltage to less than the turn-on threshold voltage. Reducing the gate voltage may reduce or stop the flow of the free charge carriers. In particular, turn-off may be divided into two stages. In the first stage, the conducting MOS channel may close, abruptly stopping the flow of negative charge carrier (e.g., electron) through the switching device. The flow of positive charge carriers (e.g., holes) remaining in the drift region however, may continue. During the second stage of turn-off, the holes are gradually removed via a dissipating electric field and recombination events (e.g., electrons transitions from a conduction band to valence band).

Because IGBTs combine the advantages of MOSFET and Bipolar Junction Transistor (BJT) technologies, IGBTs may be suitable for power electronic applications (e.g., inverters, converters, power supplies) that place current, voltage, and switching speed demands on the switching devices. For example, the switching devices in pulse-width modulated (PWM) variable drive converters may be subject to higher current, higher voltage, and relatively faster switching speed demands than can be satisfied by MOSFETs and BJTs. However, when the IGBT switching devices are subject to high current (e.g., high load current), high voltages (e.g., high direct current (DC)-link voltage), and quick switching speeds during turn-off, the electron current may disappear while a substantial hole current remains. This may result in a large electrical field gradient that increases the electric field strength to at least a maximum strength tolerable by the IGBT switching device.

At these strengths, the holes may be accelerated by the electric field to speeds that are sufficient enough to free charge carriers bound to the device material when the holes collide with the atoms of the material. The creation of additional free charge carriers may lead to further freeing of bound charge carriers and a deceleration of the current turn-off in the switching device. This event is known as a dynamic avalanche and may result in restriction of viable operation ranges for the switching device, wearing of the switching device material over time, and eventual degradation of switching device performance. Further, the time (e.g., switching time) taken for the switching device to turn-off may become longer since the additional current adds to the recombination current, thereby slowing down the turn-off. As such, multiple occurrences of dynamic avalanche may ultimately result in failure of the switching device and components (e.g., power converters) that employ the switching device.

With this in mind, gate driving techniques may be implemented to efficiently control the switching device. For example, gate driving techniques may maintain an open MOS channel during a portion of turn-off, thereby allowing a longer period of electron flow to quickly remove the residual hole current and electric field gradients. Standard gate driving techniques however, may not adequately remove the electric field gradients and thus, may not reduce or suppress dynamic avalanche events. Briefly, standard gate driving techniques may be implemented using a gate resistor ($R_{gON}$) coupled to the gate terminal during turn-on and another gate resistor ($R_{gOFF}$) coupled to the gate terminal during turn-off. These gate resistors may reduce parasitic oscillation (e.g. ringing). During turn-off, the standard gate driving techniques may apply a negative voltage (e.g., −15 V) to the $R_{gOFF}$ to discharge an input capacitance of the switching device and thereby, compensate the hole current. However, the standard gate driving techniques may not allow for enough control to suppress dynamic avalanche events without significant turn-off losses.

Accordingly, the presently disclosed embodiments are directed to systems and methods for controlling the occurrence of dynamic avalanche events by using advanced gate-driving techniques. In some embodiments, during turn-off, a gate-drive unit may first apply an intermediate gate voltage level at the gate terminal until the hole current is substantially commutated. The gate-drive unit may then apply a negative turn-off voltage (e.g., −15 V) to maintain the switching device in a turned-off state. The intermediate gate voltage level, in some embodiments, may be adjusted based on parameters of the switching device and/or the system at turn-off, such as a junction temperature and DC-link voltage, and may be of a value between that of the turn-off threshold (0-7V) and the turn-off voltage (−15V). Further, in some embodiments, the intermediate gate voltage level and/or the negative voltage level may be generated and applied to the gate terminal by modifying multiple resistive stages coupled to the gate terminal and/or the voltage/current supplied by the power rails coupled to the resistive stage(s).

Figure 1:
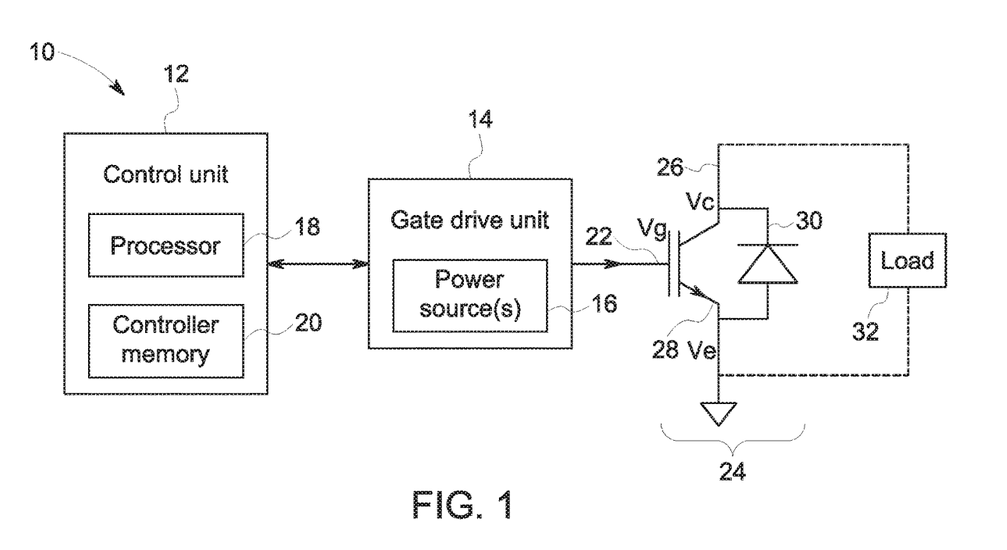
FIG. 1 is a schematic diagram illustrating an embodiment of an electrical system that includes a semiconductor switching device and a gate-drive unit, in accordance with aspects of the present disclosure.

Turning now to the figures, FIG. 1 is an example of an electrical system 10 that may be used in power electronics applications and other suitable applications for a switching device. The electrical system 10 may include a control unit 12 that coordinates operations of the electrical system 10. To facilitate coordination, the control unit 12 may include controller memory 20 that stores instructions for controlling components of the system 10. For example, the controller memory 20 may store instructions for modifying a configuration of the resistor stages of the gate-drive unit 14. In some embodiments, the controller memory 20 may be a computer readable medium, such as a hard disk drive, a solid state drive, a diskette, a flash drive, a compact disc, a digital video disc, random access memory (RAM), firmware, read-only memory (ROM, erasable programmable read-only memory (EPROM), flash memory, etc.) and/or any suitable storage device that enables processor to store, retrieve, and/or execute instructions (e.g., code) and/or data. The controller memory 20 may also include one or more local and/or remote storage devices. Further, the controller unit 12 may include a processor 18 that executes the instructions stored in the controller memory 20. As such, the processor 18 may include one or more general purpose microprocessors, one or more application specific processors (ASICs), one or more field programmable logic arrays (FPGAs), system-on-chip (SoC) device, or any combination thereof.

The controller unit 12 may be communicatively coupled to the gate-drive unit 14. The gate-drive unit 14 may include various circuitry to control the state (e.g., turn-on, turn-off) of one or more switching devices 24. For example, the gate-drive unit 14 may include a level shifter, amplifier, and one or more resistor stages whose configuration may be modified to deliver an appropriate voltage to the gate terminal 22 during turn-off. Additionally, the gate-drive unit 14 may include power source(s) 16 used to drive the one or more resistor stages. The power source(s) 16 may be fixed power source(s) and/or variable power source(s) that output voltage or current levels based on indications by the control unit 12. In some embodiments, the gate-drive unit 14 may include the control unit 12. In either case, the gate-drive unit 14 may receive commands from the control unit 12 and/or may feedback information the system's 10 operations. For example, the gate-drive unit 14 may transmit information regarding the junction temperature of the switching device 24, ambient temperature, magnitude of the current propagating through the switching device 24 during turn-off, and the like.

The gate-drive unit 14 may be coupled to the semiconductor switching device 24, such as an IGBT. The switching device 24 may include the gate terminal 22, a collector terminal 26, and an emitter terminal 28. Briefly, a voltage applied to the gate terminal 22 may turn-on (e.g., enable propagation of current) or turn-off (e.g., disable propagation of current) the switching device 24 depending on whether the applied voltage is greater than a turn-on voltage threshold for the switching device 24. To control the operating state of the switching device 24, the gate terminal 22 may be coupled to the gate-drive unit 14 that applies the appropriate voltage to open or close a conducting MOS channel between the collector terminal 26 and the emitter terminal 28. The collector terminal 26 may "collect" charge carriers (e.g., electrons, holes) during turn-on and transmit them to the emitter terminal 28 via the MOS channel. Because the collector terminal and emitter terminal may be joined by the MOS channel that allows for the flow of charge carriers through the switching device 24, these terminals 26, 28 may be referred to as power terminals.

In some embodiments, a diode 30 (e.g., body diode) and an electrical load 32 may be electrically coupled to the switching device 24 at terminals 26 and 28. The electrical load 32 may be a load combustion machine or another electrical component that consumes electrical power. In some embodiments, the electrical load 32 may be inductive (e.g., resist change in current) and may cause the load current to flow in a opposite direction than the direction of current in the switching device 24. As such, the diode 30 may provide an alternative flow path for the load current in a direction opposite to that of the current in the switching device 24. Further, the diode 30 may prevent high voltage peaks that may damage the switching device 24 and which may arise when there is no compensation path for the load current. It should be appreciated that the electrical system 10 may include additional components, such as additional switching devices 24. Further, it should be understood that the gate-drive unit 14 may be used to control the operations of the additional switching devices 24 and/or additional gate-drive units 14 may be included to independently control the operations of the additional switching devices 24.

Figure 2:
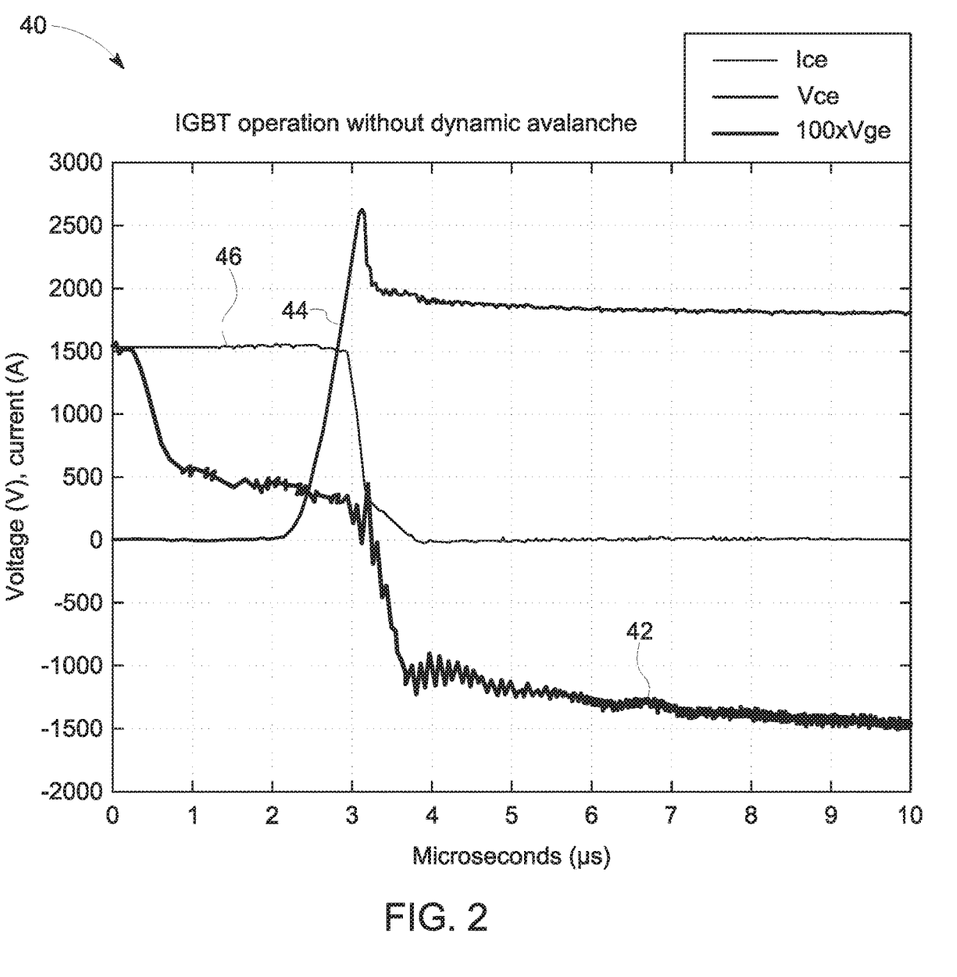
FIG. 2 is a graph illustrating electrical behavior of the semiconductor switching device of FIG. 1 in the absence of a dynamic avalanche event, in accordance with aspects of the present disclosure.

Under normal conditions, electrical behavior of the switching device 24 may occur in a generally predictable manner. Graph 40 of FIG. 2 shows an example of the semiconductor device 24 behavior during turn-off and in absence of a dynamic avalanche event. In this example, the gate-drive unit 14 may begin turning off the switching device 24 by reducing the voltage 42 applied to the gate terminal 22. As shown, the gate voltage 42 may be maintained at 15 V prior to turn off and gradually decrease during a first phase (e.g., 0-1 µs) of turn off. During the first phase, the collector-emitter voltage 44 may remain at 0 V and as such, current (e.g., of electrons) 46 flowing through the MOS channel may be maintained at nearly a constant magnitude as that prior to turn-off of the switching device 24. The current 46 value may be based on the current drawn by the electrical load 32 and control methodologies implemented by the gate-drive unit 14.

During the second phase (e.g., 1-3 µs) of turn-off, Miller effect, or an increase in input capacitance of the switching device 24, may occur. The Miller effect may slow down the decrease of the gate voltage 42 and force the gate voltage 42 to remain at a nearly constant value (e.g., between 4-5 V). Collector-emitter voltage 44 may increase to a maximum peak voltage value due to parasitic inductance in the circuit coupled to the switching device 24. In phase three (e.g., 3-3.5 μs) of turn-off, the Miller effect may no longer have an influential effect on the behavior of the switching device 24. As such, the collector-emitter current 46, the collector-emitter voltage 44, and the gate voltage 42 may rapidly drop.

During phase four (e.g., 3.5-10 μs) of turn-off, the gate voltage 42 may finally reach and/or drop below the turn-on voltage threshold (e.g., 3 V) for the switching device 24. At this point, the conducting MOS channel between the collector terminal 26 and the emitter terminal 28 may close, substantially stopping the collector-emitter current 46 flow and turning off the switching device 24. In some embodiments, the current 46 may not immediately stop once the gate voltage 42 reaches the turn-on voltage threshold due to recombination of minority charge carriers (e.g., holes) that remain in a drift region of the switching device 24. This may lead to significant turn-off losses (e.g., switching loss).

In some embodiments, power electronics applications may occasionally place relatively high voltage, high current, and switching speed demands on the switching device 24, resulting in the appearance of a dynamic avalanche event that affects the operation behavior of the switching device 24. As shown in graph 50 of FIG. 3, the dynamic avalanche may decrease the differential gate voltage 44 (dVce/dt) at the turn-off point. In other words, rather than a roughly constant differential gate voltage 44 when the collector-emitter current 46 value is dropping, the differential gate voltage 44 appears bent 52.

Figure 3:
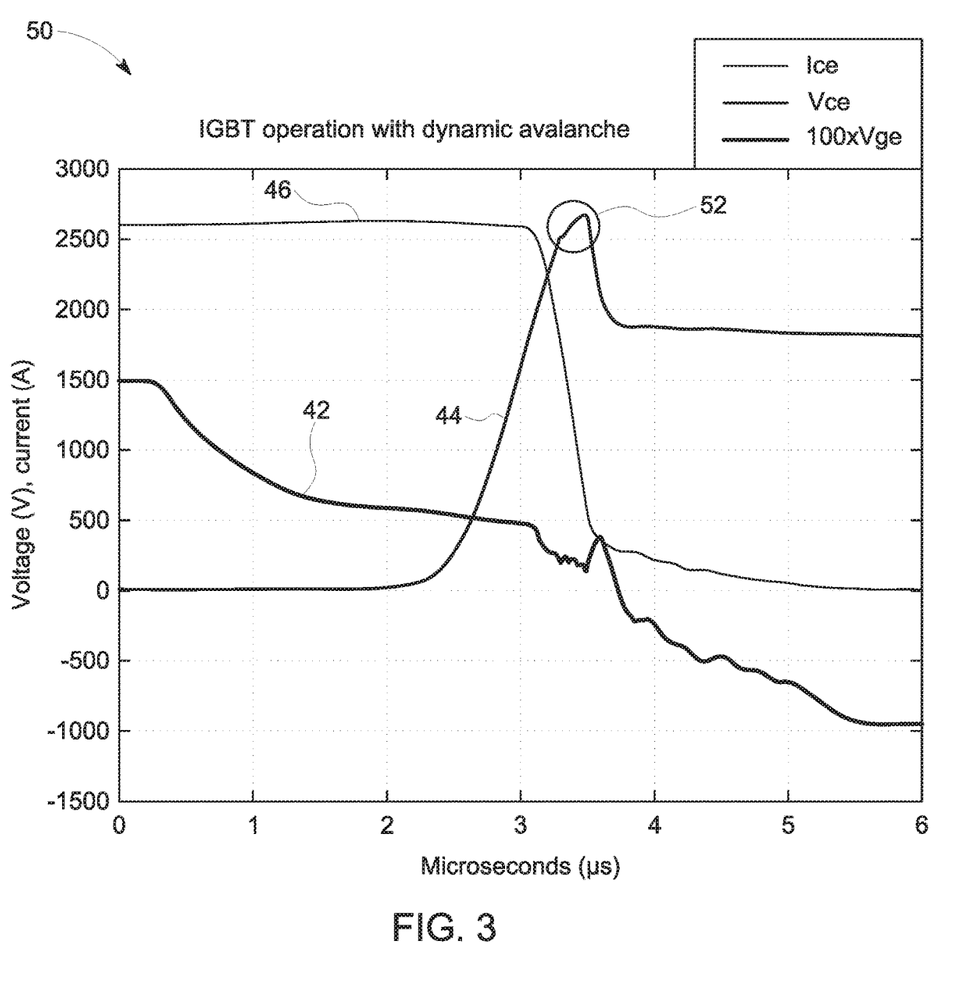
FIG. 3 is a graph illustrating electrical behavior of the semiconductor switching device of FIG. 1 in presence of a dynamic avalanche event, in accordance with aspects of the present disclosure.

As previously mentioned, the occurrence of the dynamic avalanche event may be determined by the current and voltage demands placed on the switching device 24. For example, current demand by the electrical load 32 may result in the collector-emitter current 46 having a higher value (e.g., 2500 A) as compared to the collector-emitter current 46 value (e.g., 500 A) in graph 40. The presence of a dynamic avalanche event may result in the degradation of switching device material and overtime, performance and reliability deterioration of the switching device 24. Although implementation of the switching device 24 may not intend for the switching device 24 to operate beyond the avalanche breakdown region (e.g., at voltage and/or current levels higher than recommended), the electrical system 10 may occasionally force the switching device 24 to operate under conditions that induce a dynamic avalanche event.

Figure 4:
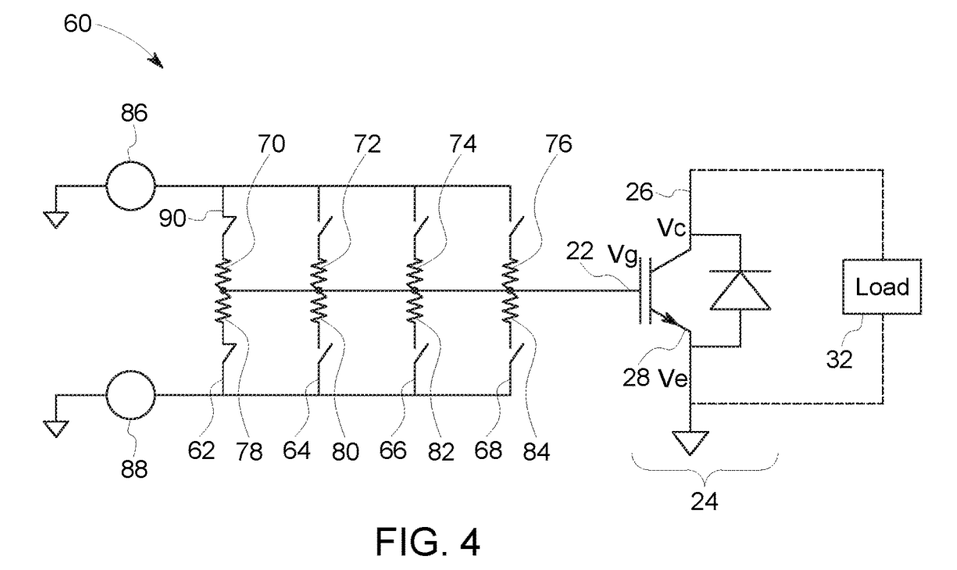
FIG. 4 is a schematic diagram illustrating an implementation of the gate-drive unit of FIG. 1 including a multi-resistive driving stage, in accordance with aspects of the present disclosure.

As such, FIG. 4 is an implementation 60 of the gate-drive unit 14 that may reduce or eliminate the occurrence of the dynamic avalanche event during turn-off. In particular, the gate-drive unit 14 may be implemented using multiple resistor stages 62, 64, 66, 68. To reduce or eliminate the occurrence of the dynamic avalanche event, the control unit 12 may instruct the gate-drive unit 14 to apply an intermediate voltage to the gate terminal 22 via a combination of gate resistors 70-84 until the collector-emitter current has been commuted. That is, the gate voltage may be varied by using a voltage divider between a positive power bus and a negative power bus. As an example, the control unit 12 may close a switch 90 to couple the gate resistor 70 to the positive power bus driven by a positive power source 86, such as a voltage source or a current source. To complete the voltage divider, the control unit 12 may also control a switch 90 to couple the gate resistor 84 to the negative power bus driven by a negative power source 88, such as a voltage source or a current source. Based on the chosen gate resistors 70-84, which may each have different resistor values, the intermediate voltage applied to the gate terminal 22 may be varied between the voltage range provided by the power sources 86 and 88. Further, the effective gate resistance may be varied to appropriately reduce parasitic oscillation at the gate terminal 22.

In some embodiments, the intermediate voltage level may be chosen based on system operation parameters. For example, the configuration of the resistor stages 62, 64, 66, 68 may be modified to provide an intermediate voltage that is less than or equal to the turn-on voltage threshold of the switching device 24. Additionally or alternatively, the intermediate voltage level may be based on an estimate of a junction temperature of the switching device 24. Because the turn-on threshold voltage of the switching device 24 may be dependent on the junction temperature, the control unit 12 may appropriately reduce the intermediate voltage level to remain equal to or less than the turn-on threshold voltage. The junction temperature may be determined via thermistor and/or based on a model that may predict the junction temperature after a certain period of operation by the switching device 24. In some embodiments, the intermediate voltage level may be a function of the switching device 24 current and/or voltage since the dynamic avalanche event may be dependent on these parameters. For instance, at a given voltage, the dynamic avalanche event may occur before the current reaches a value level. As the voltage increases, the dynamic avalanche event may occur before the current reaches a lower value level Further, in some embodiments, the intermediate voltage may be applied above a certain operating voltage threshold. For example, the intermediate voltage may be applied to the gate terminal 22 when the DC-link voltage is above the operating voltage threshold to reduce turn-off losses. Additionally or alternatively, the control unit 12 may instruct the gate-drive unit 14 to apply the intermediate voltage during voltage operation range pertinent to system reliability. As an example, the intermediate voltage may not be applied to the gate terminal 22 when the voltage operation range (e.g., Vce) is lower than an operating voltage threshold due to power losses and/or lack of dynamic avalanche events during operations in this low voltage band. In a medium voltage range (e.g., 1000 V-1500 V), dynamic avalanche event may be more likely to occur and as such, the control unit 12 may instruct the gate-drive unit 14 to apply the intermediate voltage. At high voltage ranges (e.g., >1500 V), the intermediate voltage may not be applied since the intermediate voltage may cause voltage peaks that are greater than the tolerable limit of the switching device 24 and which may deteriorate the switching device 24 more than an occurrence of dynamic avalanche event. As another example, the intermediate voltage may not be applied at certain system and/or ambient temperatures that would result in extra losses.

In some embodiments, the control unit 12 may measure the differential voltage of the switching device 24 to determine whether a dynamic avalanche is occurring. In instances when the dynamic avalanche event occurs, this may be used to change the gate driving technique from a standard turn-off technique to an advanced gate driving technique that applies the intermediate voltage. In additional embodiments, the value of the intermediate voltage may be adjusted as the DC-link voltage varies. By adjusting the intermediate voltage based on the DC-link voltage, the interception point of the dynamic avalanche may be adjusted to further reduce turn-off loss. As such, the value of the intermediate voltage and the period during which the intermediate voltage is applied to the gate terminal 22 may be modified to control dynamic avalanche events and to reduce turn-off losses and system inefficiency.

Once the collector-emitter current has been commuted, a larger negative voltage supply (e.g., ~–15V) may be applied to the gate terminal 22 to ensure that the switching device 24 remains turned-off even in the presence of large electromagnetic interferences due to high voltage and high current previously applied to the switching device 24. By applying an intermediate voltage and subsequently the negative voltage supply, dynamic avalanche events may be suppressed with minor increases in turn-off loss, extending the lifetime and preserving the reliability of the switching device 24. It should be appreciated that although four resistive branches 62, 64, 66, 68 are shown, a greater or fewer number of resistive branches may be included during implementation.

Figure 5:
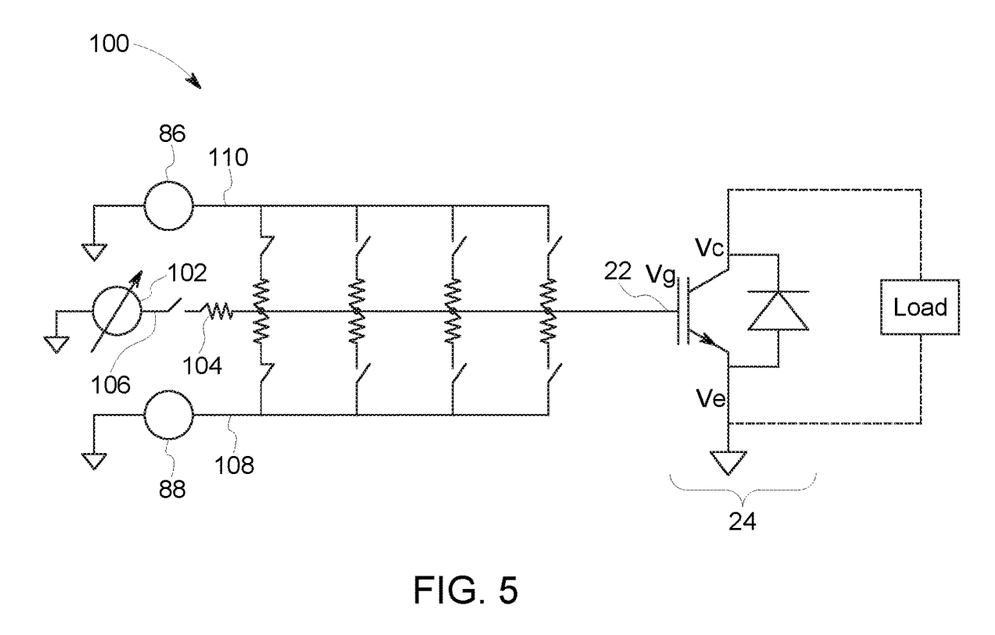
FIG. 5 is a schematic diagram illustrating another implementation of the gate-drive unit of FIG. 1 including the multi-resistive driving stage and a variable power rail, in accordance with aspects of the present disclosure.

FIG. 5 depicts an alternative implementation 100 of the gate-drive unit 14 may include the multi-resistive driving stage and a third power rail 106 driven by a variable power source 102, such as a variable voltage source or a variable current source. Similar to the implementation 60 of the gate-drive unit 14, the implementation 100 may apply an intermediate voltage to the gate terminal 22 by modifying the configuration of the multi-resistive driving stage. In some embodiments, the variable power source 102 may also apply an intermediate voltage to the gate terminal 22 via a dedicated gate resistor 104 and a dedicated gate resistor switch that couples the variable power source 102 to the dedicated gate resistor 104. Further, the variable power source 102 and the third power rail 102 may be used to apply the negative power supply to the gate terminal 22 after the collector-emitter current has been commuted to ensure that the switching device 24 remains in turned-off even in the presence of large electromagnetic interferences. In some embodiments, a fixed power source may be used to drive the third power rail 102.

Figure 6:
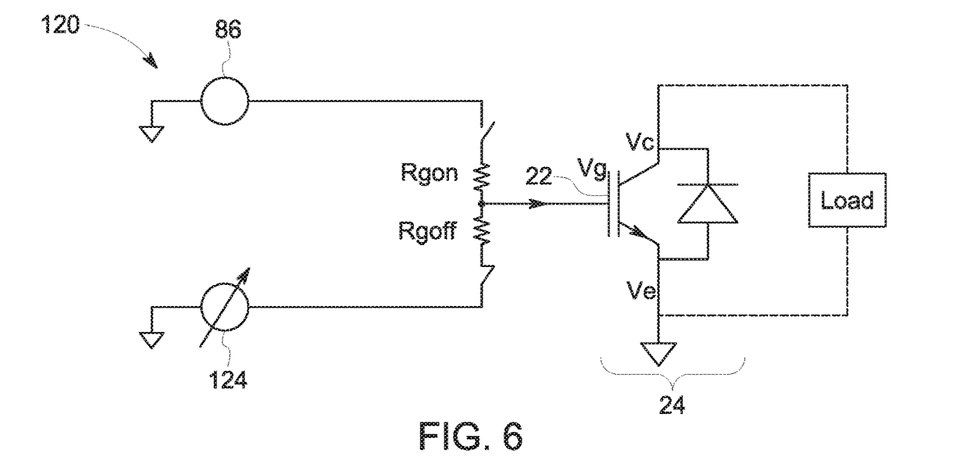
FIG. 6 is a schematic diagram illustrating another implementation of the gate-drive unit of FIG. 1 driven by a negative variable power rail, in accordance with aspects of the present disclosure.

In additional or alternative embodiments, the gate-drive unit 14 may be implemented 120 using a negative power rail that is driven by a variable power source 124 (e.g., variable current source, variable voltage source), as shown in FIG. 6. The output by the variable power source 124 may be dynamically adjusted to provide an intermediate voltage to the terminal gate 22 that controls the occurrence of dynamic avalanche events without significant turn-off losses. In the implementation 120, the variable power source 124 may provide the adjustment functionality of the additional resistor stages 62-68 and power rails 104, 106, 110 of implementations 60 and 100. As such, use of additional resistor stages 62-68 and power rails 104, 106, 110 may be avoided.

Figure 7:
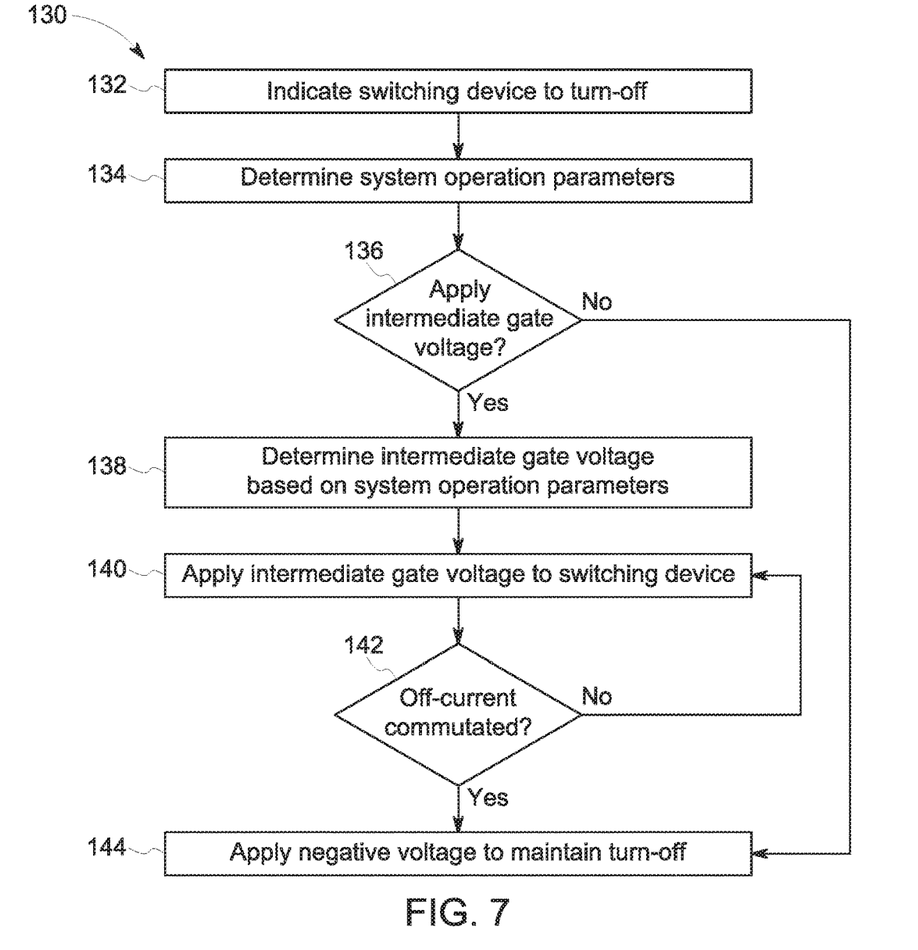
FIG. 7 depicts a flow diagram of an example method for driving the semiconductor switching device of FIG. 1 using the gate-drive unit, in accordance with aspects of the present disclosure.

FIG. 7 illustrates an embodiment of a method 130 for driving the switching device 24 using the gate-drive unit 14 implementations 60, 100, and 120. While the method 130 is described using steps in a specific sequence, it should be understood that the present disclosure contemplates that the described steps may be performed in different sequences than the sequence illustrated, and certain described steps may be skipped or not performed altogether. In some embodiments, at least some of the steps of the method 130 may be implemented at least in part by the control unit 12 that executes instructions stored in a tangible, non-transitory, computer-readable medium, such as the controller memory 20. In alternative or additional embodiments, at least some steps of the method 130 may be implemented by any other suitable processing or control circuitry of the system 10.

The illustrated method 130 begins with the control unit 12 indicating to the gate-drive unit 14 that the switching device 24 should turn-off, for example, to stop power delivery to the electrical load 32 (process block 132). Upon receiving the indication from the control unit 12, the gate-drive unit 14 may determine various system operation parameters by measuring the parameters and/or estimating the parameter values based on the operation time of the switching device 24 (process block 134). For example, the system operation parameters may include the voltage and current applied to the terminals 22, 26, 28 of the switching device 24, junction temperature, system temperature, DC-link voltage, the differential voltage, and the like.

Based on the system operation parameters, the control unit 12 may determine whether to apply the intermediate gate voltage to the gate terminal 22 (decision block 136). In some embodiments, the voltage (e.g., DC-link voltage) applied to the terminals may be high enough that suppressing the dynamic avalanche effect will result in further deterioration of the switching device 24 material due to a higher voltage peak than when the dynamic avalanche event is not suppressed. As another example, when the differential voltage of the voltage peak remains relatively consistent, the control unit 12 may determine that a dynamic avalanche event is not occurring and thus, the intermediate voltage should not be applied. When the control unit 12 determines that the intermediate gate voltage should not be applied, a negative voltage may instead be applied to the gate terminal 22 to ensure that the switching device 24 remains in turned-off despite electromagnetic interference (process block 144).

When the control unit 12 determines that the intermediate gate voltage should be applied, the control unit 12 may determine the appropriate intermediate gate voltage to suppress the dynamic avalanche event without significant turn-off losses (process block 138). The intermediate gate voltage may be determined based on the system operation parameters measured by the gate-drive unit 14 and/or estimated based on a model. The control unit 12 may then instruct the gate-drive unit 14 to apply the intermediate gate voltage to the switching device 24 (process block 140). For example, a portion of the switches coupling gate resistors 70-76 of the multiple resistor stages 62-68 may close to create a voltage divider between the rail power sources 86 and 88. As another example, the output of a variable power source 124 may be adjusted to deliver the appropriate intermediate gate voltage.

The control unit 12 may periodically determine whether the off-current (e.g., the collector-emitter current) of the switching device 24 has been substantially commutated (decision block 142). If the off-current has not been substantially commutated, then the control unit 12 may continue applying the intermediate gate voltage to the gate terminal 22 (process block 140). In some embodiments, the control unit 12 may increase the level of the intermediate gate voltage applied for a steady voltage progression. When the off-current has been substantially commutated, the control unit 12 may instruct the gate-drive unit 14 to apply the negative voltage (e.g., turn-off voltage) that maintains the switching device 24 in the turned-off state using, for example, a third power rail 106 (process block 144). Additionally or alternatively, in some embodiments, the control unit 12 may apply the intermediate gate voltage to the gate terminal 22 in an open-loop manner. That is, the control unit 12 may apply the intermediate gate voltage for a predetermined period determined based on system operation parameters.

Figure 8:
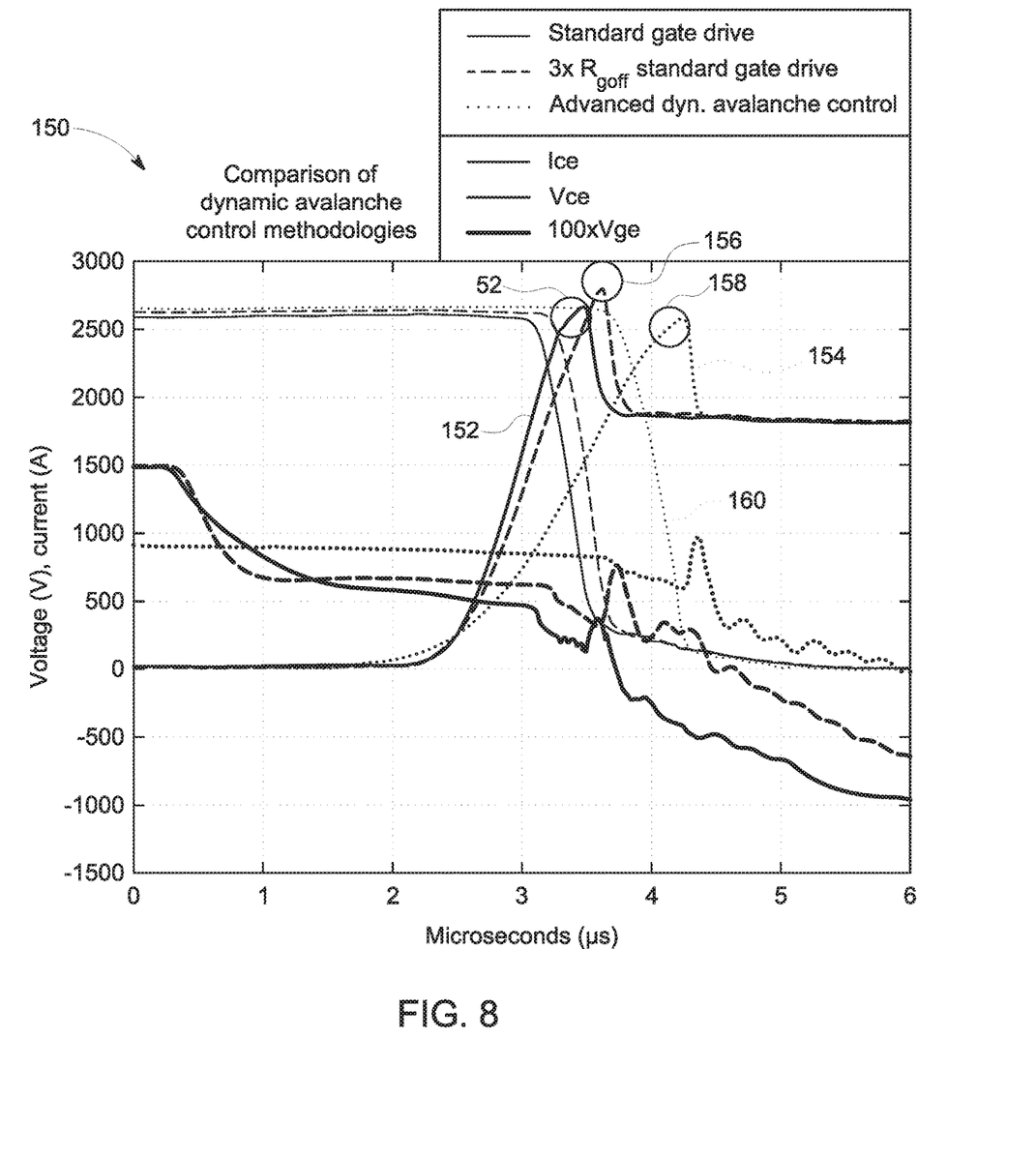
FIG. 8 is a graph comparing the electrical behavior of the semiconductor switching device of FIG. 1 when using different techniques to drive the semiconductor switching device.

Driving the switching device using method 130 may result in the suppression of dynamic avalanche events without significant turn-off losses. As shown, the graph 150 of FIG. 8 illustrates a comparison between dynamic avalanche control techniques. In the standard gate-drive technique, the gate-drive unit may apply the negative voltage (e.g., −15 V) that maintains the switching device 24 in a turned-off state even in instances where the collector-emitter current has not been commuted. The standard gate-drive technique does not allow for independent control of the rise time of voltage 152 and/or the dynamic avalanche event, as shown by the bend in the differential peak voltage 52.

The standard gate-drive technique may be modified by employing a turn-off gate resistor that has three times the resistance than that recommended with the standard gate-drive technique. In such instances however, the dynamic avalanche event may still occur, as shown by a bend in the differential peak voltage 158. Further, the higher resistance value of the gate resistor may increase turn-off losses (e.g., Vce 154×Ice 160) up to 45% of that seen when using the standard gate-drive technique. In contrast, using the advanced dynamic avalanche control technique detailed by method 130 may allow for adequate suppression of the dynamic avalanche event, as shown by the absence of a bend in the differential peak voltage 156. Further, the overall turn-off loss using the advanced dynamic avalanche control technique may increase by a mere 10% as compared to the standard gate-drive technique.

Although previous discussions of dynamic avalanche suppression include using the gate-drive unit 14 as a voltage source to apply an intermediate gate voltage and/or the turn-off voltage, techniques implementing the gate-drive unit 14 as a current source are also contemplated. In particular, the power rails (e.g., 106, 108, 110) may be driven using one or more current sources that control the current input to the gate terminal 22. For example, a current source and a gate resistor (e.g., 70) may be coupled to the gate terminal 22. As another example, a current mirror driven by one or more power sources may be used to control the current input to the gate terminal 22. Similar to the voltage source gate-drive unit 14 implementations, an intermediate current input may be applied to the gate terminal 22 until the switching device 24 current has been commuted. The intermediate current input may be applied in response to determining that dynamic avalanche conditions are present. For example, an intermediate current input may be applied when the system temperature, junction temperature, differential peak voltage, and the like, are outside of an acceptable range. A current of a larger, negative magnitude may subsequently be applied to the gate terminal 22 to maintain the switching device 24 in a turned-off state.

Technical effects of the embodiments presented herein include suppressing dynamic avalanche events in high-power switching devices 24 (e.g., trench-gate IGBTs) to improve switching device 24 lifetime and operating reliability. As discussed herein, using the advanced dynamic avalanche control technique may adequately reduce or eliminate dynamic avalanche events without a significant increase in turn-off switching losses. This may allow for implementation of switching devices 24 in the electrical system 10 that may normally be disqualified due to lifetime limitation by dynamic avalanche degradation effects. Further, implementation of the advanced dynamic avalanche control technique may occur without using special, additional hardware that may be bulky and costly. Additionally, the present embodiments may enable tuning of the switching device 24 behavior to account for trade-offs between useable voltage ranges, dynamic avalanche events, turn-off losses, and voltage peak variations.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An electrical system comprising:
   a gate-drive unit electrically coupled to a semiconductor switching device, wherein the gate-drive unit is configured to apply a voltage to a gate terminal of the semiconductor switching device; and
   a controller configured to:
      indicate to the semiconductor switching device to turn-off;
      determine system parameters in response to indicating to the semiconductor switching device to turn-off;
      determine an intermediate gate voltage based at least in part on the system parameters, wherein the intermediate gate voltage is between a turn-off threshold and a turn-off voltage;
      configure the gate-drive unit to apply the intermediate gate voltage at the gate terminal, wherein the controller is configured to determine whether to apply the intermediate gate voltage based on the system parameters, wherein determining whether to apply the intermediate gate voltage comprises:
         determining the voltage applied to the semiconductor switching device prior to turn-off, a current propagating through the semiconductor switching device prior to turn-off, a differential peak voltage, or a combination thereof; and
         determining whether the voltage, the current, the differential peak voltage, or the combination thereof are within a respective threshold range; and
      configure the gate-drive unit to apply the turn-off voltage at the gate terminal subsequent to application of the intermediate gate voltage, wherein the turn-off voltage is applied in response to commutation of a current propagating through the semiconductor switching device.

2. The electrical system of claim 1, wherein the semiconductor switching device is a trench-gate insulated-gate bipolar transistor (IGBT).

3. The electrical system of claim 1, wherein the system parameters comprise a junction temperature of the semiconductor switching device, an ambient temperature, a direct current (DC)-link voltage, or a combination thereof.

4. The electrical system of claim 1, wherein the turn-off voltage is substantially more negative than the intermediate gate voltage.

5. The electrical system of claim 4, wherein the turn-off voltage is −15 volts.

6. The electrical system of claim 1, wherein the turn-off threshold is zero to seven volts.

7. The electrical system of claim 1, wherein the gate-drive unit comprises:
   one or more power sources configured to drive one or more power rails, wherein the one or more power sources comprises a voltage source, a current source, or a combination thereof; and one or more resistor stages, wherein each of the one or more resistor stages is coupled to the gate terminal and to the one or more power rails, wherein each of the one or more resistor stages comprises a positive bus gate resistor and a negative bus gate resistor coupled to the one or more power rails using a respective switch.

8. The electrical system of claim 7, wherein configuring the gate-drive unit to apply the intermediate gate voltage comprises coupling a respective positive bus gate resistor and a respective second bus gate resistor to the one or more power rails via the respective switch.

9. A method to mitigate occurrences of dynamic avalanche events in a semiconductor switching device, comprising:
    determining one or more values of system parameters in response to indicating the semiconductor switching device to enter a turn-off mode;
    determining whether to apply an intermediate gate voltage to the semiconductor switching device, wherein determining whether to apply the intermediate gate voltage comprises:
        determining a voltage applied to the semiconductor switching device prior to turn-off, a current propagating through the semiconductor switching device prior to turn-off, a differential peak voltage, or a combination thereof; and
        determining whether the voltage, the current, the differential peak voltage, or a combination thereof are within a respective threshold range;
    in response to determining to apply an intermediate gate voltage, determining an intermediate gate voltage based at least in part on the one or more values, wherein the intermediate gate voltage comprises a voltage between a turn-off threshold and a turn-off voltage;
    configuring a gate-drive unit coupled to the semiconductor switching device to a first configuration for applying the intermediate gate voltage;
    applying the intermediate gate voltage in response to configuring the gate-drive unit to the first configuration;
    configuring the gate-drive unit to a second configuration for applying the turn-off voltage; and
    applying the turn-off voltage in response to configuring the gate-drive unit to the second configuration.

10. The method of claim 9, wherein the system parameters comprise a junction temperature of the semiconductor switching device, an ambient temperature, a direct current (DC)-link voltage, or a combination thereof.

11. The method of claim 9, wherein configuring the gate-drive unit to a first configuration comprises coupling at least a portion of one or more resistor stages of the gate-drive unit to one or more power rails of the gate-drive unit.

12. The method of claim 9, wherein configuring the gate-drive unit to the second configuration occurs in response to commutation of a current propagating through the semiconductor switching device by the intermediate gate voltage.

13. The method of claim 9, wherein configuring the gate-drive unit to the second configuration occurs subsequent to applying the intermediate gate voltage to the semiconductor switching device in response to determining to apply the intermediate gate voltage.

14. The method of claim 13, wherein the intermediate gate voltage is applied to the semiconductor switching device for a predetermined period of time, wherein the predetermined period of time is determined based on system operation parameters.

15. An electrical system comprising:
    a gate-drive unit electrically coupled to a semiconductor switching device, wherein the gate-drive unit is configured to apply a voltage to a gate terminal of the semiconductor switching device, wherein the gate-drive unit comprises:
        one or more power sources configured to drive one or more power rails, wherein the one or more power sources comprises a voltage source, a current source, or a combination thereof; and
        one or more resistor stages, wherein each of the one or more resistor stages is coupled to the gate terminal and to the one or more power rails, wherein each of the one or more resistor stages comprises a positive bus gate resistor and a negative bus gate resistor coupled to the one or more power rails using a respective switch; and
    a controller configured to:
        indicate to the semiconductor switching device to turn-off;
        determine system parameters in response to indicating to the semiconductor switching device to turn-off;
        determine an intermediate gate voltage based at least in part on the system parameters, wherein the intermediate gate voltage is between a turn-off threshold and a turn-off voltage;
        configure the gate-drive unit to apply the intermediate gate voltage at the gate terminal; and
        configure the gate-drive unit to apply the turn-off voltage at the gate terminal subsequent to application of the intermediate gate voltage, wherein the turn-off voltage is applied in response to commutation of a current propagating through the semiconductor switching device.

16. The electrical system of claim 15, wherein the semiconductor switching device is a trench-gate insulated-gate bipolar transistor (IGBT).

17. The electrical system of claim 15, wherein the system parameters comprise a junction temperature of the semiconductor switching device, an ambient temperature, a direct current (DC)-link voltage, or a combination thereof.

18. The electrical system of claim 15, wherein the turn-off voltage is −15 volts.

19. The electrical system of claim 15, wherein the turn-off threshold is zero to seven volts.

20. The electrical system of claim 15, wherein configuring the gate-drive unit to apply the intermediate gate voltage comprises coupling a respective positive bus gate resistor and a respective second bus gate resistor to the one or more power rails via the respective switch.

* * * * *